(12) United States Patent
Yamazaki et al.

(10) Patent No.: US 6,294,799 B1
(45) Date of Patent: *Sep. 25, 2001

(54) SEMICONDUCTOR DEVICE AND METHOD OF FABRICATING SAME

(75) Inventors: Shunpei Yamazaki, Tokyo; Takeshi Fukunaga, Kanagawa, both of (JP)

(73) Assignee: Semiconductor Energy Laboratory Co., Ltd., Kanagawa-ken (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/755,735

(22) Filed: Nov. 25, 1996

(30) Foreign Application Priority Data

Nov. 27, 1995 (JP) .................................... 7-332630
Dec. 9, 1995 (JP) .................................... 7-345631

(51) Int. Cl.[7] .................................................. H01L 29/04
(52) U.S. Cl. ............................. 257/72; 257/66; 257/642; 257/774
(58) Field of Search ............................. 257/642, 66, 72, 257/774, 773

(56) References Cited

U.S. PATENT DOCUMENTS

| | | | |
|---|---|---|---|
| 4,040,083 | * 8/1977 | Saiki et al. | 257/643 |
| 4,103,297 | 7/1978 | McGreivy et al. | 345/90 |
| 4,365,264 | * 12/1982 | Mukai et al. | 257/759 |
| 5,003,356 | 3/1991 | Wakai et al. | 257/390 |
| 5,032,883 | 7/1991 | Wakai et al. | 257/59 |
| 5,055,906 | * 10/1991 | Mase et al. | 257/643 |
| 5,056,895 | 10/1991 | Kahn | 349/114 |
| 5,084,905 | 1/1992 | Sasaki et al. | 257/776 |
| 5,117,278 | * 5/1992 | Bellersen et al. | 257/776 |
| 5,200,846 | 4/1993 | Hiroki et al. | 349/174 |
| 5,235,195 | 8/1993 | Tran et al. | 257/59 |
| 5,264,077 | 11/1993 | Fukui et al. | 216/51 |
| 5,264,731 | * 11/1993 | Tamura et al. | 257/791 |
| 5,287,205 | 2/1994 | Yamazaki et al. | 349/174 |
| 5,308,998 | 5/1994 | Yamazaki et al. | 257/57 |
| 5,327,001 | 7/1994 | Wakai et al. | 257/350 |
| 5,414,442 | 5/1995 | Yamazaki et al. | 345/89 |
| 5,453,858 | 9/1995 | Yamazaki | 349/43 |
| 5,495,353 | 2/1996 | Yamazaki et al. | 349/43 |
| 5,550,405 | * 8/1996 | Cheung et al. | 257/642 |
| 5,568,288 | 10/1996 | Yamazaki et al. | 349/42 |
| 5,604,380 | * 2/1997 | Nishimura et al. | 257/758 |
| 5,612,799 | 3/1997 | Yamazaki et al. | 349/42 |
| 5,614,732 | 3/1997 | Yamazaki | 257/66 |
| 5,717,224 | 2/1998 | Zhang | 257/57 |
| 5,784,073 | 7/1998 | Yamazaki et al. | 345/511 |
| 5,847,410 | 12/1998 | Nakajima | 257/59 |
| 5,879,974 | 3/1999 | Yamazaki | 438/162 |
| 5,905,555 | 5/1999 | Yamazaki et al. | 349/138 |
| 5,925,421 | 7/1999 | Yamazaki et al. | 427/534 |
| 5,933,205 | 8/1999 | Yamazaki et al. | 349/43 |
| 5,940,732 | 8/1999 | Zhang | 438/640 |

(List continued on next page.)

FOREIGN PATENT DOCUMENTS

7314375 * 4/1974 (NL) .................................... 257/642

OTHER PUBLICATIONS

Nikkei Microdevices, pp. 140–141, Nov., 1995. (English Abstract attached).

Primary Examiner—Eddie Lee
Assistant Examiner—George C. Eckert, II
(74) Attorney, Agent, or Firm—Fish & Richardson P.C.

(57) ABSTRACT

A semiconductor device having reliable electrode contacts. First, an interlayer dielectric film is formed from a resinous material. Then, window holes are formed. The interlayer dielectric film is recessed by oxygen plasma. This gives rise to tapering window holes. This makes it easy to make contacts even if the circuit pattern is complex.

32 Claims, 9 Drawing Sheets

U.S. PATENT DOCUMENTS

| | | | |
|---|---|---|---|
| 5,946,059 | 8/1999 | Yamazaki et al. | 349/43 |
| 5,952,708 | 9/1999 | Yamazaki | 257/643 |
| 5,956,105 | 9/1999 | Yamazaki et al. | 349/43 |
| 5,963,278 | 10/1999 | Yamazaki et al. | 349/43 |
| 5,977,562 | 11/1999 | Hirakata et al. | 257/72 |
| 5,990,491 | 11/1999 | Zhang | 257/57 |
| 6,015,724 | 1/2000 | Yamazaki | 438/151 |
| 6,027,960 | 2/2000 | Kusumoto et al. | 438/166 |

* cited by examiner

SEMICONDUCTOR DEVICE AND METHOD OF FABRICATING SAME

BACKGROUND OF THE INVENTION

1. Field of the Invention

The present invention relates to a semiconductor device structure having an interlayer dielectric film made of a resinous material. The invention also relates to a method of fabricating such a semiconductor device structure.

2. Description of the Related Art

Techniques for fabricating thin-film transistors (TFTs), using a thin film semiconductor formed on a glass substrate or quartz substrate, have been known.

The prior art steps for fabricating a TFT are shown in FIGS. 3(A) and 3(B). This TFT is disposed in a pixel region of an active matrix liquid crystal display.

First, a silicon oxide film is formed as a buffer layer 302 on a substrate 301 of glass or quartz to a thickness of 3000 Å by plasma CVD. Then, an amorphous silicon film (not shown) is formed to a thickness of about 500 to 1500 Å by plasma CVD or LPCVD. This amorphous film acts as a starting film in forming an active layer of TFTs. Subsequently, the amorphous silicon film (not shown) is heat-treated or illuminated with laser light to crystallize the amorphous film. In this way, a crystalline silicon film (not shown) is obtained.

Then, this crystalline silicon film is patterned to form regions (303, 304, 305 in FIG. 3(A)) which will become the active layer of the TFTs later. Thereafter, a silicon oxide film 306 which covers the active layer and acts as a gate-insulating film is formed to a thickness of 1000 to 1500 Å by plasma CVD. Then, a gate electrode 307 is formed from a metallic material or silicide material. Thus, a state shown in FIG. 3(A) is obtained. Under this condition, dopant ions are implanted, and the source region 303, the drain region 305, and the channel formation region 304 are formed by self-aligned technology. This is followed by heat-treatment or laser illumination, for annealing the doped regions.

Then, a first dielectric film 308 is formed from silicon nitride or silicon oxide to a thickness of 2000 to 6000 Å by plasma CVD. Subsequently, contact holes are formed. A source electrode and interconnects, 309, extending from it are formed from an appropriate metal material (FIG. 3(B)).

Then, a second interlayer dielectric film 310 is formed from silicon oxide or silicon nitride. The thickness of this second interlayer dielectric film is set greater than 7000 Å to assure that the surface is sufficiently flat. Then, a contact hole 311 is formed, thus obtaining a state shown in FIG. 3(C).

Thereafter, an ITO electrode 312 forming a pixel electrode is formed. In consequence, a TFT disposed in the pixel region of the active matrix regions is completed. During these fabrication steps, the formation of the pixel electrode 312 presents the following problems.

In recent years, the sizes of conductor patterns and TFT patterns have tended to diminish, because there is an increasing demand for increased device densities. Furthermore, active matrix liquid crystal displays are required to reduce such patterns to increase the aperture ratio of pixels.

As such patterns are reduced in size, it is, of course, necessary to reduce the size of the window hole 311. However, if the contact hole 311 is reduced in size, the material, or ITO, of the pixel electrode 312 does not form a film with good coverage within the small hole. As a result, it is difficult to make required contacts. In particular, the contact hole is elongated. The material for making a contact may break inside the hole. As a consequence, poor contact takes place.

SUMMARY OF THE INVENTION

It is an object of the present invention to provide techniques for solving problems associated with poor contact caused as finer-line patterns are utilized.

An embodiment of the present invention described herein is shown in FIGS. 1(A)–1(C), where a semiconductor device has a multilayer dielectric film consisting of dielectric layers 114, 116, and 117. The top layer 117 is made of a resinous material. A contact hole 119 is formed in the multilayer dielectric film. This structure is characterized in that the resinous material portion around the contact hole 119 is overetched, as indicated by 100 in FIG. 2(A).

The use of this structure permits finer-line geometries. Even if the contact area decreases, it is assured that contact to a source region 110 is made by an electrode 119 consisting of a metallization level. Furthermore, this metallization level 119 is prevented from breaking, by tapering the overetched portion 100.

Moreover, the planarity of the surface is assured by forming the top layer 117 from a resinous material. Therefore, the electric field applied from the pixel electrode is not disturbed.

Another embodiment of the invention is a method of fabricating a semiconductor device. This method is illustrated in FIGS. 1(A)–1(C). This method is initiated with forming a dielectric film 116 from a silicide. Then, a dielectric film 117 is formed from a resinous material on the silicide film (a silicon-containing dielectric film). As a result, a lamination film consisting of the silicide layer 116 and the resinous layer 117 is obtained. A contact hole 119 is formed in the lamination film. The resinous layer 117 is isotropically etched, using a means capable of selectively etching the resinous material, to overetch the opening in the contact hole 119, thus forming a window hole 201.

By etching only the resinous material selectively, the window hole 119 is widened and assumes a form which facilitates making a contact. Furthermore, the tapering portion 100 can be formed by the use of isotropic etching. Hence, electrodes and conductors formed over the tapering portion 100 do not break. The aforementioned silicide (silicon-containing dielectric) can be silicon oxide, silicon nitride, or silicon oxynitride.

DETAILED DESCRIPTION OF THE PREFERRED EMBODIMENTS

EXAMPLE 1

The present example pertains to steps for fabricating TFTs arranged in pixel regions of an active matrix liquid crystal display.

Figure 1A:
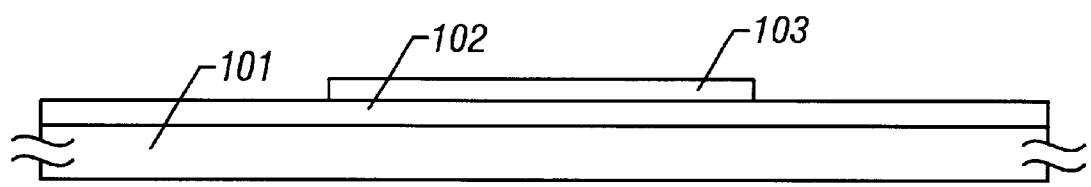
FIGS. 1(A)–1(C) and 2(A)–2(B) are cross-sectional views illustrating a process sequence for fabricating a TFT according to the present invention.
Figure 1B:
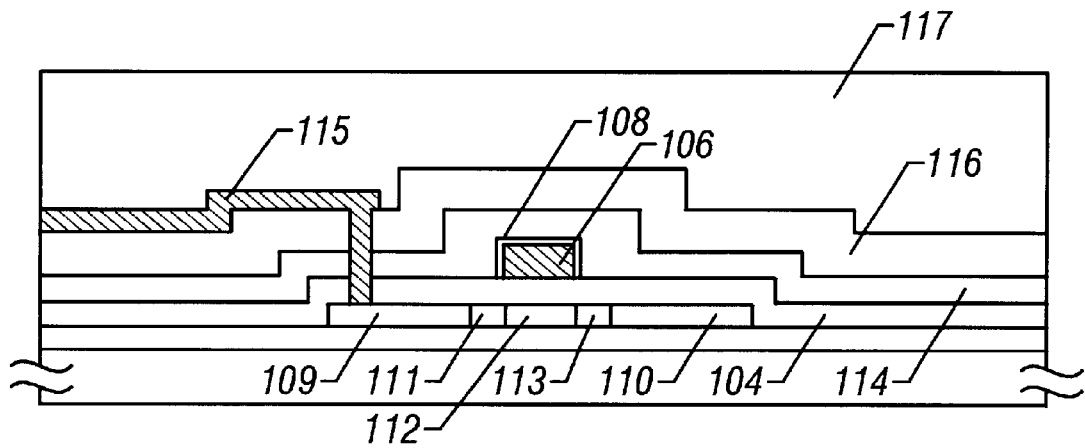
Figure 1C:
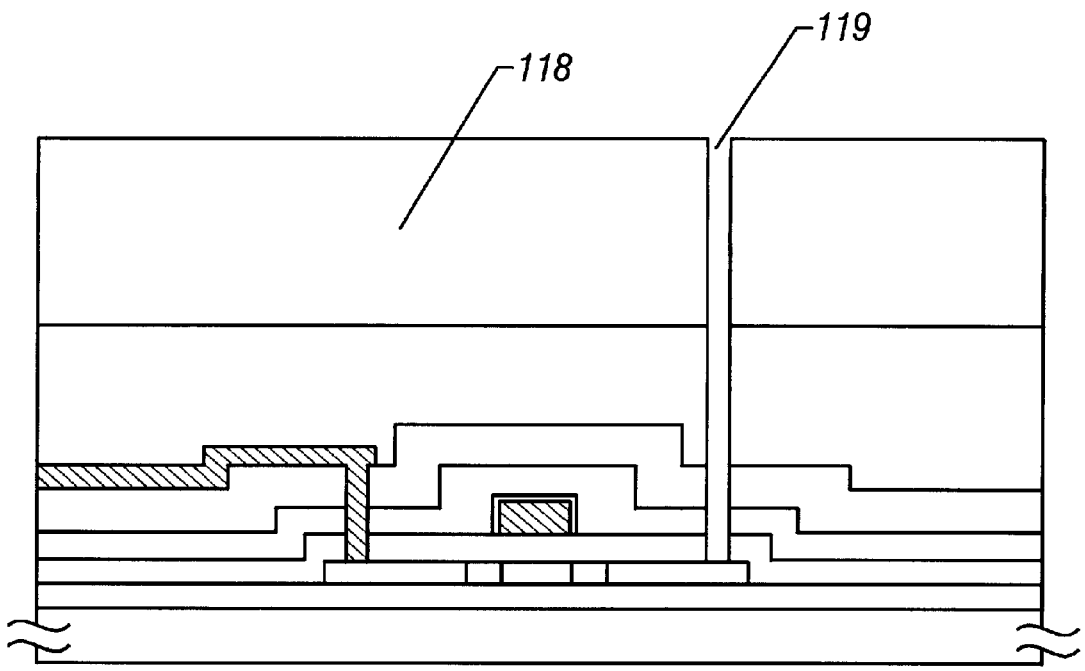

FIGS. 1(A)–1(C) illustrate steps for fabricating a TFT according to the present example. First, a silicon oxide film is formed as a buffer layer 102 on a substrate 101 of glass or quartz to a thickness of 3000 Å by plasma CVD. Then, an amorphous silicon film (not shown) is formed to a thickness of 500 Å by plasma CVD or LPCVD. This amorphous silicon film will become a starting film in forming the active layer of the TFT.

Then, the amorphous silicon film (not shown) is crystallized by illuminating it with laser light or heat-treating it. Thus, a crystalline silicon film is obtained. This crystalline silicon film will form the active layer of the TFT later.

Thereafter, the crystalline silicon film (not shown) is patterned to form the active layer 103 of the TFT. In this way, a state shown in FIG. 1(A) is obtained.

Figure 5A:
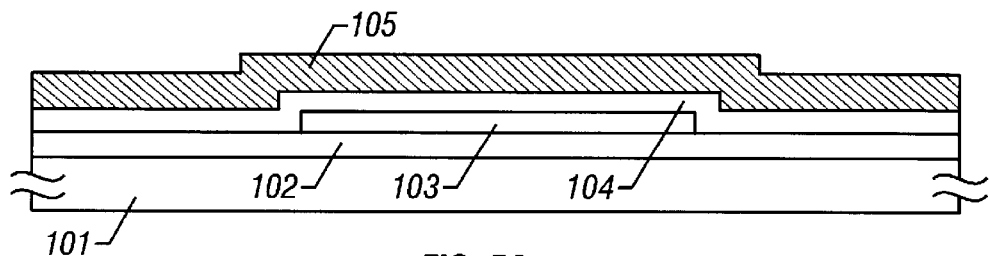
FIGS. 5(A)–5(D) are cross-sectional views, illustrating a method of fabricating a TFT according to the invention.

Then, a silicon oxide film 104 acting as a gate-insulating film is formed to a thickness of 1000 Å by plasma CVD as shown in FIG. 5(A). Subsequently, an aluminum film 105 forming a gate electrode is formed to a thickness of 4000 Å by sputtering techniques. As a result, a state shown in FIG. 5(A) is derived.

The subsequent steps will be described by referring to FIGS. 5(A)–5(D). The aluminum film 105 contains 0.1 to 0.3% by weight of scandium. This is intended to suppress overgrowth of the aluminum; otherwise projections known as hillocks and whiskers would be formed.

After the formation of the aluminum film 105, an extremely thin anodic oxide film (not shown) about 100 Å thick is formed on the surface of the aluminum film, using an electrolytic solution prepared by neutralizing 3% ethylene glycol solution with aqueous ammonia. The thickness of this anodic oxide film can be controlled by controlling the applied voltage.

Figure 5B:
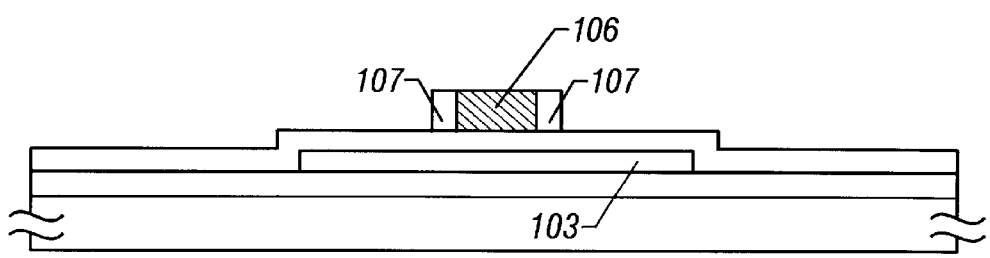

Then, as shown in FIG. 5(B), the aluminum film 105 is patterned to form a gate electrode 106. Using the gate electrode 106 as an anode, anodization is again carried out, thus forming a porous anodic oxide film 107. This anodization is carried out, using an electrolytic solution of 3% oxalic acid aqueous solution. The anodic oxide film formed by this anodization process is porous in nature. The maximum growth distance can be selected to be several micrometers. In this case, the growth distance of the anodic oxide film can be controlled by the anodization time. In this way, the state in FIG. 5(B) is obtained.

Then, a dense anodic oxide film is again formed. That is, an electrolytic solution prepared by neutralizing 3% ethylene glycol solution with aqueous ammonia is used. Anodization is effected, using the gate electrode 106 as an anode.

Figure 5C:
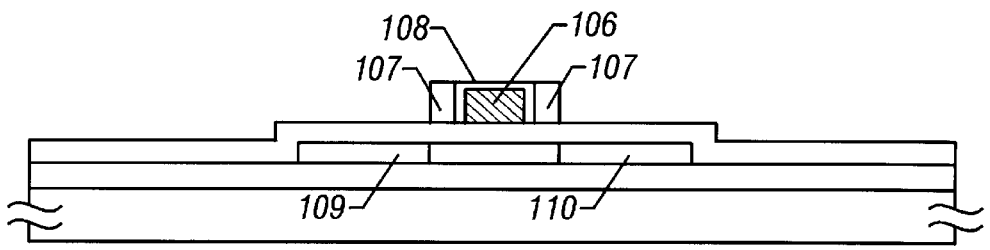

As a result of this anodization step, a dense anodic oxide film 108 is formed to a thickness of 500 Å. During this step, the electrolytic solution enters into the porous anodic oxide film 107 and so the dense anodic oxide film 108 is formed so as to cover the surface of the gate electrode 106. The anodic oxide film 108 prevents formation of hillocks and whiskers and will contribute to formation of offset gate regions. In this way, a state shown in FIG. 5(C) is obtained. Subsequently, dopant ions are implanted to impart one conductivity type. In this example, phosphorus (P) are implanted to fabricate an N-channel TFT. As a result of the implantation of the dopant ions, a source region 109 and a drain region 110 are formed by self-aligned technology (FIG. 5(C)).

Figure 5D:
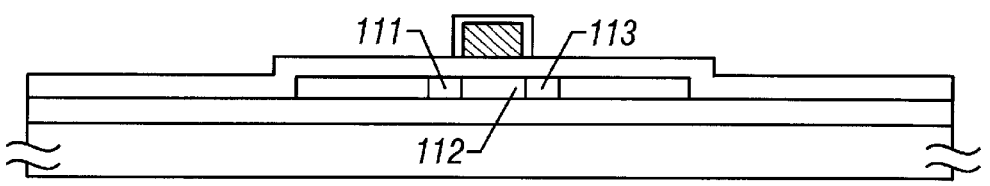

Then, the porous anodic oxide film 107 is removed, giving rise to a state shown in FIG. 5(D). Under this condition, a channel formation region 112 and offset gate regions 111, 113 are defined. The thickness of the offset gate regions 111 and 113 is determined by the total thickness of the porous anodic oxide film 107 and the dense anodic oxide film 108. Then, the laminate is irradiated with laser light to anneal the doped regions.

Subsequently, as shown in FIG. 1(B), a silicon nitride film is formed as a first interlayer dielectric film 114 to a thickness of 3000 Å by plasma CVD. A silicon oxide film is formed as a second interlayer dielectric film 116 to a thickness of 3000 Å by plasma CVD.

Then, contact holes leading to the source region 109 are formed. A source electrode and conductive interconnects 115 extending from the source electrode are formed from an appropriate metal material.

Thereafter, a third dielectric film 117 is formed from a resinous material to a thickness of 3 μm. It is important that the third interlayer dielectric film 117 is made from a resinous material, because it is necessary that the surface be flat and that the material have a low relative dielectric constant.

The necessity of the above-described flatness is associated with the fact that pixel electrodes are formed on the surface. Specifically, where the pixel electrodes are formed on a planar surface, the electric field applied to the liquid crystal material is made uniform, whereby the image is displayed without any disturbance. For this purpose, the aforementioned third interlayer dielectric film must be flat.

Since a resinous material having a relative dielectric constant lower than those of silicon oxide and silicon nitride can be selected, the effect of capacitances created between each pixel electrode and TFT formed later can be reduced. This also makes the usage of a resinous material important. After the third interlayer dielectric film 117 of the resinous material is formed, a contact hole or window hole 119 is formed by dry etching, using photoresist 118 as a mask (FIG. 1(C)). As the TFT diminishes in dimensions, the contact hole 119 must be reduced in size.

For example, it is necessary that the contacts have a diameter of 1 μm or less. However, the contact hole 119 is elongated. This renders it difficult to make a direct contact with the drain region 110. Accordingly, in the present example, during the step shown in FIG. 1(C), after the contact hole 119 is formed in the resinous material 117, it is further subjected to selective isotropic etching making use of dry etching techniques.

In the present example, it is to be noted that this isotropic etching is done after the photoresist 118 is removed. That is, the fact that the resinous material can be easily etched selectively in an oxygen ambient is utilized.

As a result of this step, only the portion of the third interlayer dielectric film 117 of the resinous material which is located over the contact hole 119 is etched away, thus enlarging the entrance to the hole. As a result, a widened contact hole 201 is created (FIG. 2(A)). This etching is carried out by plasma etching using a gas consisting mainly of oxygen.

Figure 2A:
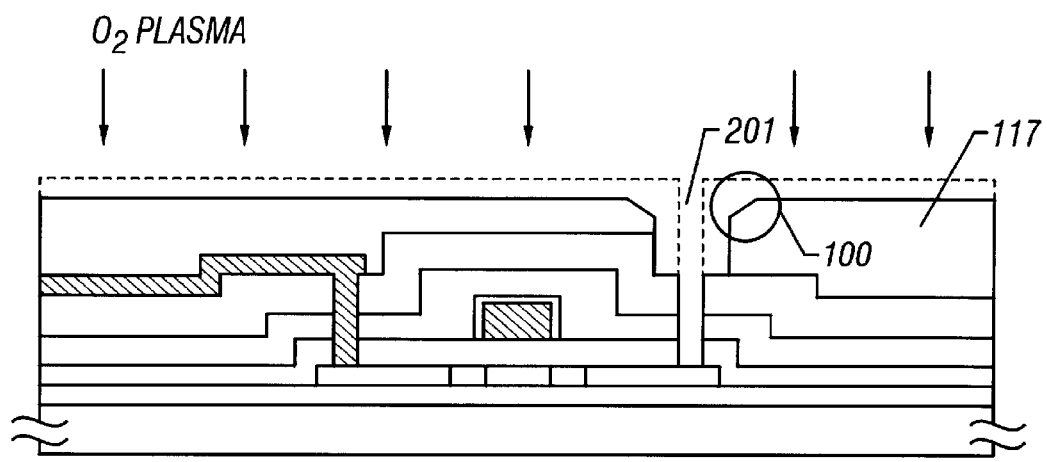

At this time, the third interlayer dielectric film 117 of the resinous material decreases in thickness. Since the interlayer dielectric film 117 is recessed isotropically, the edge portion 100 of the opening is tapered or rounded. Because of this geometry, a metallization or electrode level which will be formed for making contacts does not become discontinuous around their edges. The diameter of the contact hole 201 can be set to 2 μm, for example. In this way, a state shown in FIG. 2(A) is obtained.

Figure 2B:
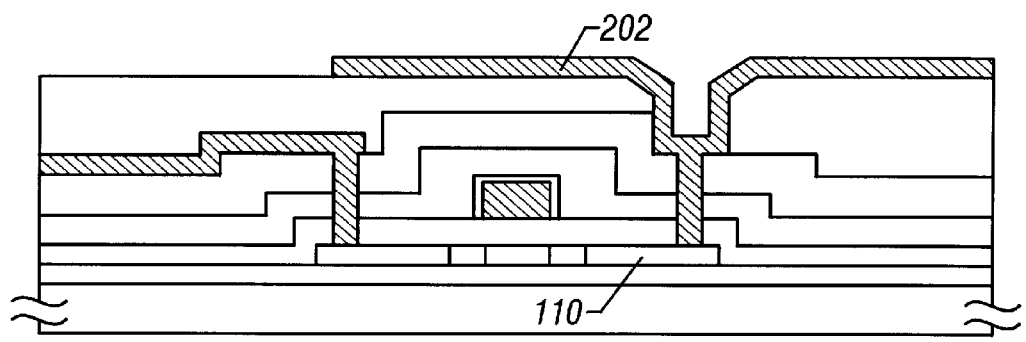
Figure 3A:
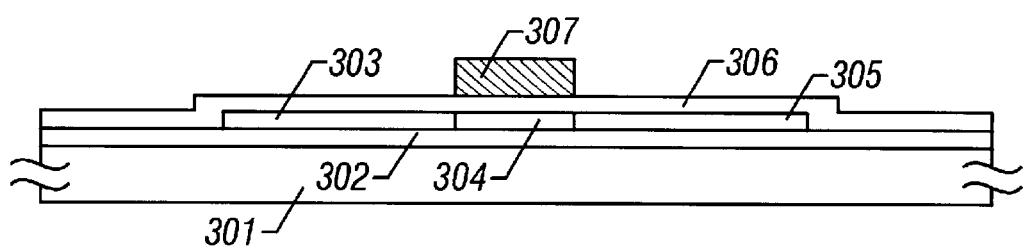
FIGS. 3(A)–3(D) are cross-sectional views of a TFT by the prior art method.
Figure 3B:
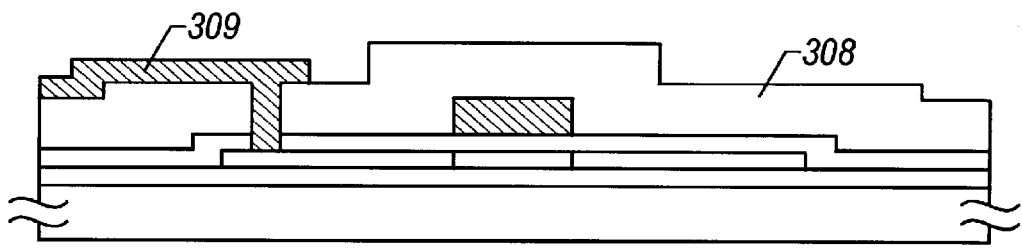
Figure 3C:
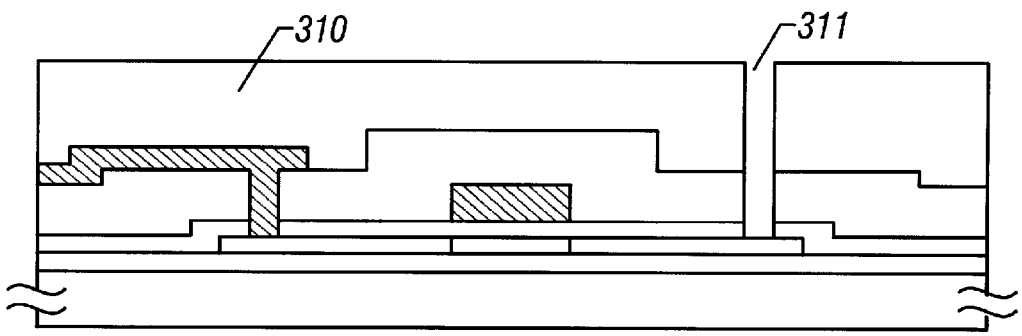
Figure 3D:
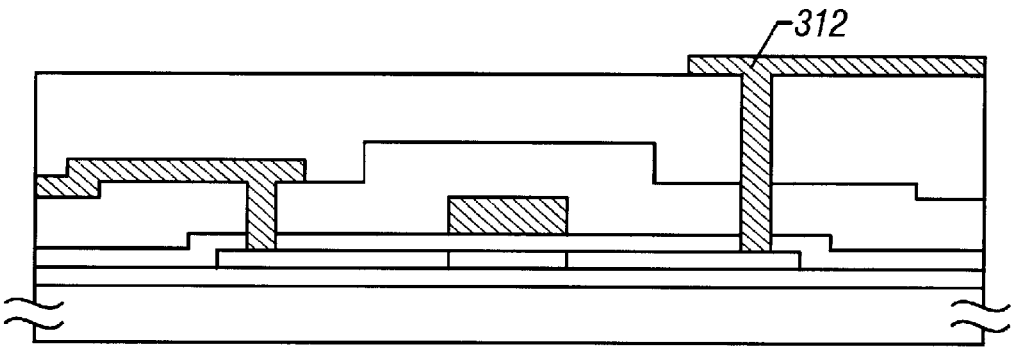

Then, as shown in FIG. 2(B), a pixel electrode 202 is formed from ITO. At this time, since the surface of the third interlayer dielectric film 117 is planarized by the use of the resinous material, the pixel electrode 202 can also be planarized. Furthermore, since the third interlayer dielectric film 117 can be made thick and its relative dielectric constant can be made small, the pixel electrode can be arranged so as to overlap the TFT, as shown in FIG. 2(B).

The opening in the contact hole 201 can be enlarged and, consequently, even if the pattern is made finer, the contact between the pixel electrode 202 and the drain region 110 can be rendered more reliable. In this manner, a TFT arranged in a pixel region of an active matrix liquid crystal as shown in FIG. 2(B) is completed.

EXAMPLE 2

The present example is similar to Example 1 described already except that the buffer layer 102 and the gate-insulating film 104 are both made of silicon oxynitride ($SiO_xN_y$). The state of the interface between the active layer 103 of semiconductor and the surrounding portion (i.e., the buffer layer 102 and the gate-insulating film 104) greatly affects the operation of the TFT.

Generally, a silicon oxide film or the like is used as a buffer layer. However, any special attention is not paid to the quality of the film. On the other hand, with respect to a gate-insulating film, much attention has been given to it, because it is considered that the gate-insulating film greatly affects the characteristics of the TFT.

Our findings reveal that it is necessary to pay much attention to the quality of the buffer layer underlying an active layer, as well as to the gate-insulating film, because the quality of the buffer layer materially affects the long-term reliability of the TFT.

In the present example, the buffer layer and the gate-insulating film are made of silicon oxynitride which is electrically stable. As a result, reliable TFTs can be obtained.

The silicon oxynitride films can be formed by plasma CVD, using TEOS gas to which $N_2O$ gas is added. Furthermore, the silicon oxynitride films can also be formed by plasma CVD, using mixture gas of oxygen and ammonia.

EXAMPLE 3

The present example pertains to separate technical means for widening window holes formed in an interlayer dielectric film made of a resinous material.

Figure 4A:
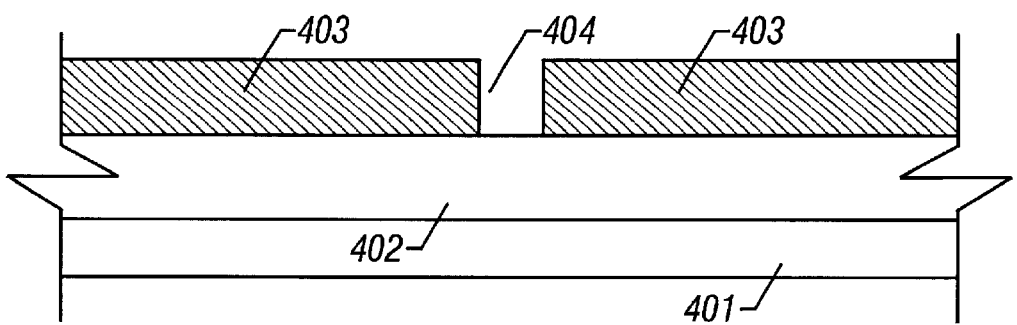
FIGS. 4(A)–4(D) are cross-sectional views, illustrating a method of forming a contact hole in accordance with the invention.
Figure 4B:
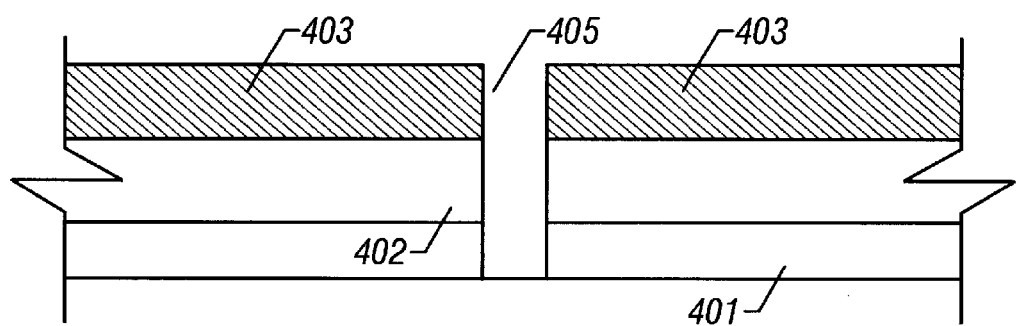

A method of forming window holes in accordance with the present example is illustrated in FIGS. 4(A)–4(D). First, as shown in FIG. 4(A), a first interlayer dielectric film 401 is formed from silicon oxide, silicon nitride, or other silicide. A layer underlying the first dielectric film is not shown but a semiconductor layer, a metallization layer, or other dielectric layer can be formed at will under the first dielectric film.

After forming the first dielectric film 401, a second interlayer dielectric film 402 is formed from a resinous material on the first dielectric film. Then, a mask 403 of photoresist is formed on the second interlayer dielectric film 402. This resist mask 403 is provided with a window hole 404 to expose the second interlayer dielectric film 402 of the resinous material (FIG. 4(A)).

Then, the first interlayer dielectric film 401 and the second interlayer dielectric film 402 are etched, using the resist mask 403, to form a window hole 405. This etching is performed by dry etching making use of RIE. During this etching step, vertically anisotropic etching takes place and so the window hole 405 is formed (FIG. 4(B)).

Then, oxygen plasma ashing which is an isotropic etching technique is carried out to ash the resist mask 403 and the second interlayer dielectric film 402. At this time, the resist mask decreases in thickness. At the same time, the window hole is tapered or rounded. Furthermore, the window hole in the second dielectric film is also tapered or rounded as indicated by 406, since it is made from a resinous material.

Figure 4C:
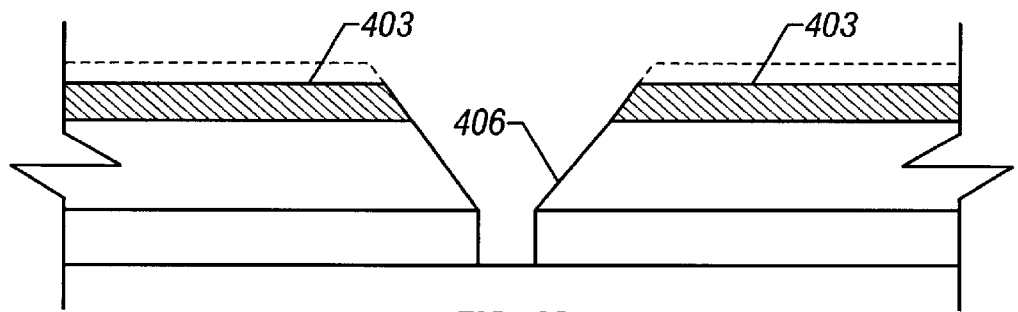
Figure 4D:
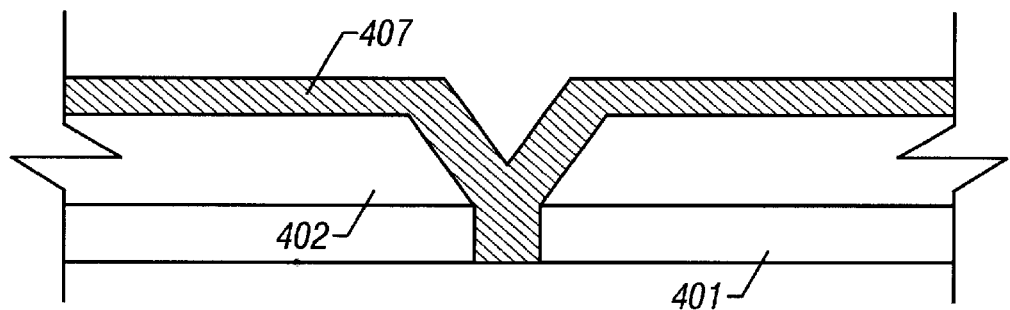

At this time, unlike the method described in Example 1, the second interlayer dielectric film made from a resinous material does not decrease in thickness. Instead, the resist mask 403 is thinned. In this way, a state shown in FIG. 4(C) is obtained. Then, the resist mask 403 is removed. Subsequently, a metallization layer 407 for making contacts is formed. Thus, a state shown in FIG. 4(D) is obtained. The present example is characterized in that the mask used to form the window hole 405 is reused to form the tapered window hole which facilitates making contacts. That is, the window hole having a cross-sectional shape shown in FIG. 4(D) is formed without using a new mask. In another feature of the present example, the second interlayer dielectric film 402 made from a resinous material is not thinned.

EXAMPLE 4

The present example relates to another technical means for widening a window hole formed in an interlayer dielectric film made from a resinous material. FIGS. 6(A)–6(D) are enlarged views of a source/drain contact hole, illustrating a method of forming the hole according to the present example.

Figure 6A:
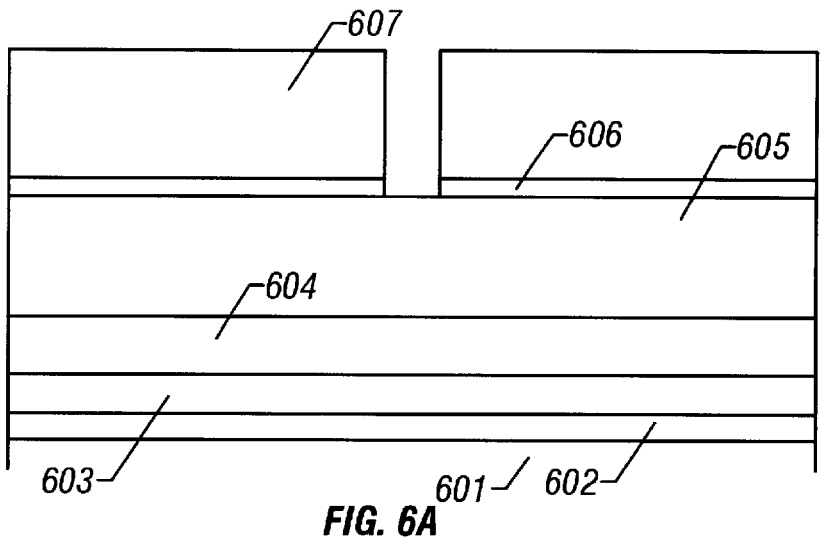
FIGS. 6(A)–6(D) are cross-sectional views, illustrating another method of forming a contact hole in accordance with the invention.

Referring to FIG. 6(A), a gate-insulating film 602 consisting of silicon oxide is formed on an active layer 601 to a thickness of 1500 Å. Then, a first interlayer dielectric film 603 of silicon nitride is formed on the gate-insulating film to a thickness of 3000 Å. A second interlayer dielectric film 604 of silicon oxide is formed on the first dielectric film to a thickness of 3000 Å. A third interlayer dielectric film 605 of a resinous material having a thickness of 3 μm is stacked on the second interlayer dielectric film. Under this state, the whole TFT assumes a state shown in FIG. 1(B).

Then, as shown in FIG. 6(A), a thin metal film 606 is formed on the third interlayer dielectric film 605 to a thickness of 500 to 2000 Å. This metal film 606 will act as a mask when the first, second, and third interlayer dielectric films 603, 604, 605 are etched by drying etching techniques later. In the present example, titanium (Ti) film is formed to a thickness of 500 Å by sputtering.

Then, the thin metal film 606 is selectively etched while masking it with photcresist 607. This etching is performed by dry etching techniques, using $SiCl_4$, $Cl_2$, and $BCl_3$ as etchant gases. The gas pressure is 80 mtorr. The applied electric power is 1400 W. As a result of these steps, a state shown in FIG. 6(A) is obtained. Then, the photoresist 607 is removed with a peeling liquid exclusively used therefor.

Figure 6B:
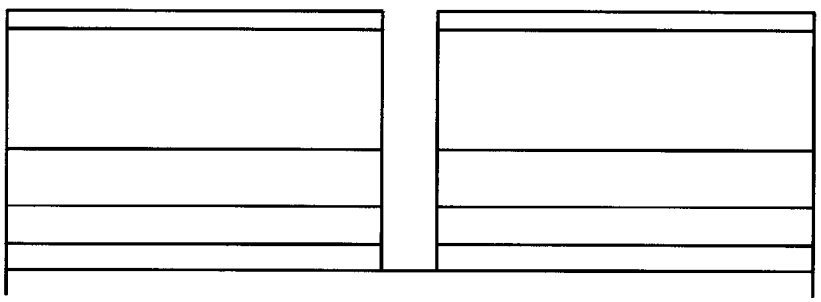

Then, as shown in FIG. 6(B), the gate-insulating film 602 and the first through third interlayer dielectric films 603–605 are etched by RIE mode dry etching. These etching processes can be carried out in succession by changing the used etchant gas. The etching processes are effected by making use of a plasma generated by rf pulses having a frequency of 13.56 MHz. $O_2$ (75 sccm) and $CF_4$ (25 sccm) are used as etchant gases. The gas pressure is 100 mtorr. The applied electric power is 500 W.

In this way, contacts of the active layer 601 are exposed, as shown in FIG. 6(B). Under this condition, the diameter of the contact hole is about 1 μm, while the depth is about 3.8 μm. This makes it very difficult to make a contact with the active layer.

Figure 6C:
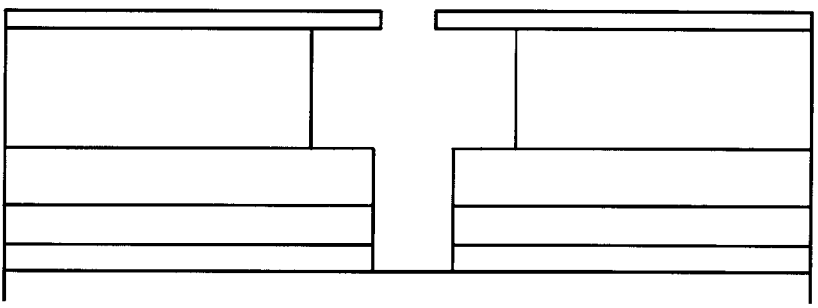
Figure 6D:
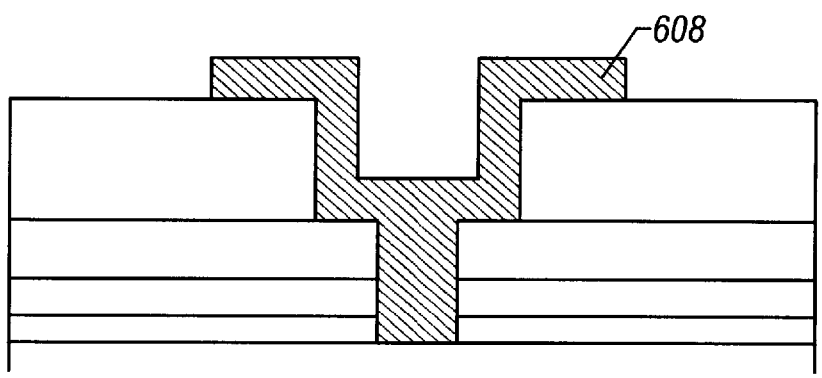

Under the condition of FIG. 6(B), isotropic plasma etching using a plasma is carried out. As a result, the third interlayer dielectric film 605 made from a resinous material is selectively etched. In this way, a state shown in FIG. 6(C) is obtained.

Figure 7A:
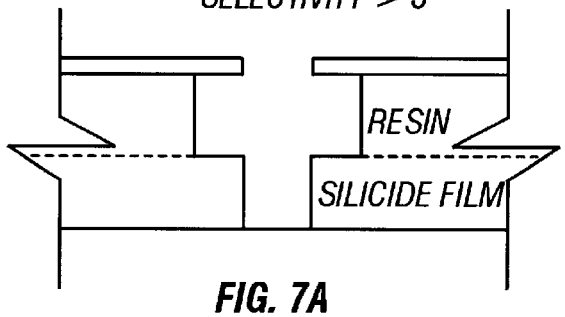
FIGS. 7(A)–7(D) are schematic cross-sectional views, showing various shapes of contact holes.
Figure 7B:
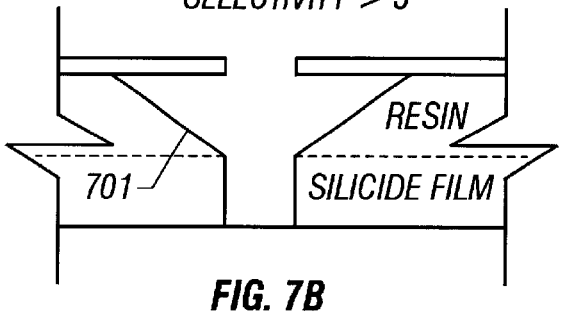

At this time, the thin metal film 606 adheres well to the third interlayer dielectric film 605. Preferably, the selectivity of the third interlayer dielectric film 605 with respect to the underlying other dielectric films (i.e., the gate-insulating film 602, the first interlayer dielectric film 603, and the second interlayer dielectric film 604) is 5 or more.

Where the above-described condition is satisfied, a shape as shown in FIG. 7(A) is obtained. For example, in the case where a titanium film is used as the thin metal film 606, a shape shown in FIG. 7(A) is obtained since adhesion is good between the titanium film 606 and the resin film 605 such as a polyimide film or the like. Where the selectivity is in excess of 5, if the adhesion is poor, then a mild taper 701 is formed, as shown in FIG. 7(B). As a result, the hole is widened excessively. This is an impediment to miniaturization of devices. For example, in the case where an indium tin oxide film is used as the thin metal film 606, a shape shown in FIG. 7(B) is obtained since adhesion is poor between the indium tin oxide film 606 and the resin film 605 such as a polyimide film or the like.

Figure 7C:
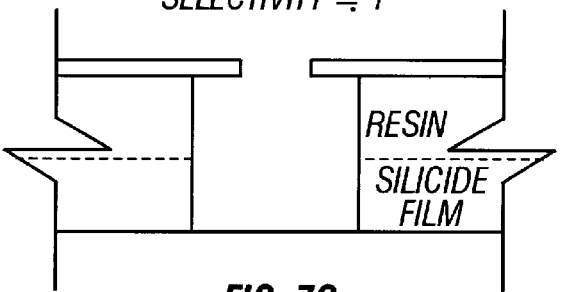
Figure 7D:
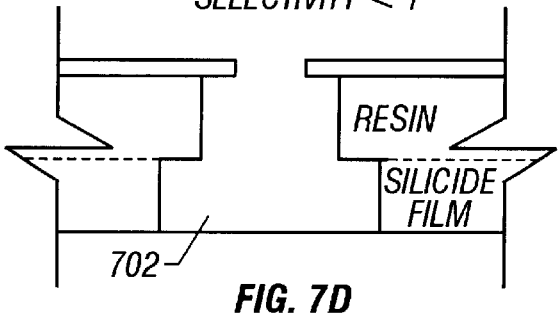

Conversely, if the selectivity is small although the adhesion is good, then the sidewalls of all the dielectric films are simultaneously etched, as shown in FIG. 7(C). Where the selectivity is less than 1, an overetched portion 702 is formed, as shown in FIG. 7(D).

After obtaining the state of FIG. 6(C), the thin metal film 606 is removed by dry etching techniques. Then, a thin metallization layer 608 becoming conductive interconnects or electrodes is formed, thus resulting in a state shown in FIG. 6(D).

The present example is characterized in that a window hole shaped so as to facilitate making contacts is formed, by utilizing the side etching of the third interlayer dielectric film 605 made from a resinous material. The present example is also characterized in that these steps beginning with the step of etching the third interlayer dielectric film 605 of the resinous material under the condition of FIG. 6(B) and ending with the step of removing the thin metal film 606 under the condition of FIG. 6(C) are carried out in succession.

More specifically, if these steps are all performed by dry etching techniques, contact holes can be formed without exposing the system to atmosphere by automatically modifying the etchant gas conditions and other conditions by a computer program. This is of importance, because the throughput is improved and, at the same time, the production yield is improved.

EXAMPLE 5

The present example is similar to EXAMPLE 4 except that a dielectric film of silicide (a dielectric film containing silicon) is formed instead of the thin metal film. The dielectric film of silicide (the dielectric film containing silicon) is easier to etch off and handle than the thin metal film. Therefore, the dielectric film of silicide (the dielectric film containing silicon) can find wider application.

Examples of the silicide of the dielectric film include silicon oxide, silicon nitride, and silicon oxynitride ($SiO_xN_y$). These dielectric films are formed by plasma CVD, LPCVD, or other means. Furthermore, the films may be formed by spin coating, using a silicon oxide-based liquid applied to form a coating, typified by PSG and BSG. The spin coating is carried out in the sequence described below.

First, the liquid is applied to a base. Then, a stage holding the base is rotated. As a result of this step, excess liquid is fully removed. A thin uniform film is formed on the base. The thickness of the film can be set to a desired value by changing the rotational speed of the stage.

Then, the film is baked at about 150° C. to crystallize the applied film. At this time, the quality of the film can be adjusted by varying the baking temperature and baking time. As described thus far, where spin coating is utilized, a silicon oxide film can be formed with relative ease. That is, the throughput can be enhanced greatly.

EXAMPLE 6

In the present example, an integrated circuit having multilevel metallization is built by making use of the present invention. Integrated circuits using single-crystal silicon wafers are required to have multilevel devices and multilevel metallization to increase the device density. This multilayer structure is also required to make contacts certainly. The invention assures making contacts even in fine-line multilevel integrated circuits.

FIGS. 8(A)–8(D) show a three-level integrated circuit as an example. First, a first metallization layer 801 is formed from a metallic material. A layer underlying the first metallization layer 801 is not shown. The underlying layer may be any of semiconductor layer, metallization layer, and other dielectric layer.

Then, a dielectric film 802 made of a silicide (a dielectric film containing silicon) is formed over the first metallization layer 801. A dielectric film 803 is formed from a resinous material on the dielectric film 802. The lamination of the dielectric films 802 and 803 acts as a first interlayer dielectric film.

Figure 8A:
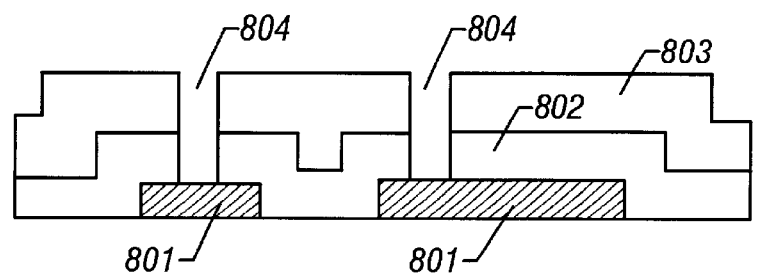
FIGS. 8(A)–8(D) are cross-sectional views of a multilevel metallization structure according to the invention.

Thereafter, a contact hole 804 is formed in the first dielectric film, thus obtaining a state shown in FIG. 8(A). Then, the dielectric film 803 of the resinous material is selectively overetched to widen the opening in the contact hole. This step may be carried out by any of the means described in Examples 1, 3, and 4.

Figure 8B:
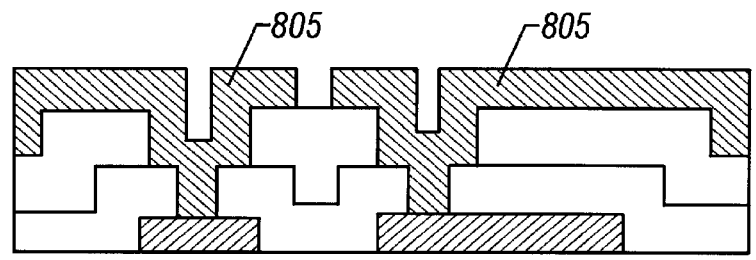

Then, a second metallization layer 805 is formed, thus obtaining a state shown in FIG. 8(B)., At this time, since the opening in the contact hole is wide, contact with the first metallization layer 801 can be made with good coverage. Thereafter, a dielectric film 806 of a silicide (a dielectric film containing silicon) is formed over the second metallization layer 805. A dielectric film 807 is formed from a resinous material on the dielectric film 806. The lamination of the dielectric films 806 and 807 serves as a second interlayer dielectric film.

Figure 8C:
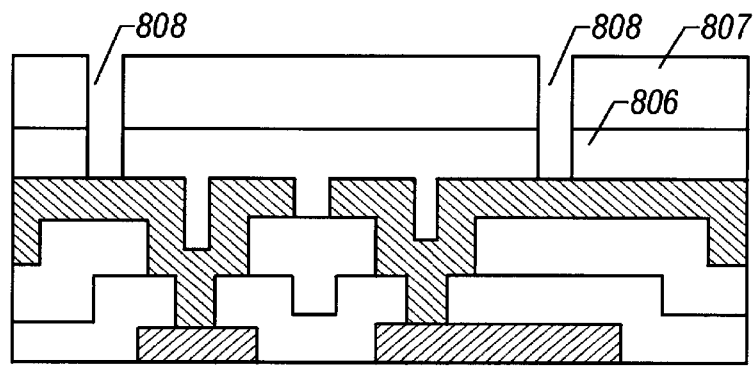

Subsequently, contact holes 808 are formed in the second interlayer dielectric film, thus obtaining a state shown in FIG. 8(C). The dielectric film 807 of the resinous material is selectively overetched to widen the openings in the contact holes. This step may be carried out, using any of the means described in Examples 1, 3, and 4.

Figure 8D:
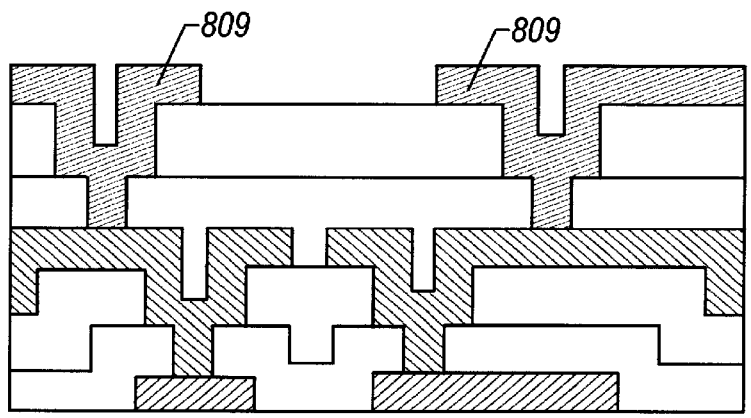

Then, a third metallization layer 809 is formed, resulting in a state shown in FIG. 8(D). At this time, since the openings in the contact holes are wide, contact with the second metallization layer 805 can be made with good coverage. The present example is an example of a multilayer structure including three metallization layers. Obviously, the same principle applies to cases where the number of levels is increased further with increasing device density.

As described thus far, every layer can be planarized by utilizing the present invention described herein. Furthermore, contacts can be made reliably. In addition, the reliability of wiring can be enhanced.

EXAMPLE 7

The present example is an example in which an integrated circuit having multilevel metallization is built, by exploiting the present invention. This example is similar to Example 5 except that different metallization levels are partially connected to each other by making use of selective growth of tungsten (W). Tungsten (W) selective growth technology has attracted attention in recent years as a metallization formation technique, especially as a microlithography technique for it. Briefly, this technique consists of selectively forming a thin film of W by a thermal CVD process, using $WF_6$ and $SiH_4$ as main gaseous raw materials. This technique has the feature that the thin film is not readily formed on a silicon oxide film. That is, only the inside of the contact holes formed in the silicon oxide film can be selectively filled with W. Therefore, this technique has the advantage that greater margin can be imparted to the contact holes in integrated circuit design.

However, this process is carried out at relatively high temperatures and so it is often difficult to fabricate interlayer dielectric films from resinous materials. Furthermore, where deep contact holes are filled with W, the throughput deteriorates. Accordingly, where the present invention is practiced, using a resin as the material of an interlayer dielectric film after the final high-temperature heating step, the circuit is built advantageously. For example, shallow contact holes are filled by selective growth of W. If deep contact holes are necessary, the present invention may be exploited, by previously using a resin finding wide application as the material of an interlayer dielectric film.

EXAMPLE 8

The present example relates to a further technical means for widening window holes formed in an interlayer dielectric film made from a resinous material. This method is illustrated in FIGS. 9(A)–9(D). First, a first interlayer dielectric film 401 is formed from silicon oxide or silicon nitride. A layer underlying the first dielectric film is not shown but a semiconductor layer, a metallization layer, or other dielectric layer can be formed at will under the first dielectric film.

Then, a second interlayer dielectric film 402 made of a resinous material is formed on the first interlayer dielectric film 401. A mask 403 of photoresist is formed on the second interlayer dielectric film 402. The resist mask 403 has a window hole 404 to expose the second interlayer dielectric film 402 in this portion (FIG. 9(A)).

Thereafter, the first interlayer dielectric film 401 and the second interlayer dielectric film 402 are etched, using the resist mask 403, thus obtaining a window hole 405. This etching is performed by dry etching making use of RIE. During this etching step, vertically anisotropic etching takes place and so the window hole 405 is formed (FIG. 9(B)).

Then, oxygen plasma ashing which is an isotropic etching technique is carried out to ash the resist mask 403 and the second interlayer dielectric film 402. At this time, the resist mask decreases in thickness. At the same time, the window hole is tapered or rounded. Furthermore, the window hole in the second dielectric film is also tapered or rounded as indicated by 406, since the second dielectric film is made from a resinous material.

Figure 9A:
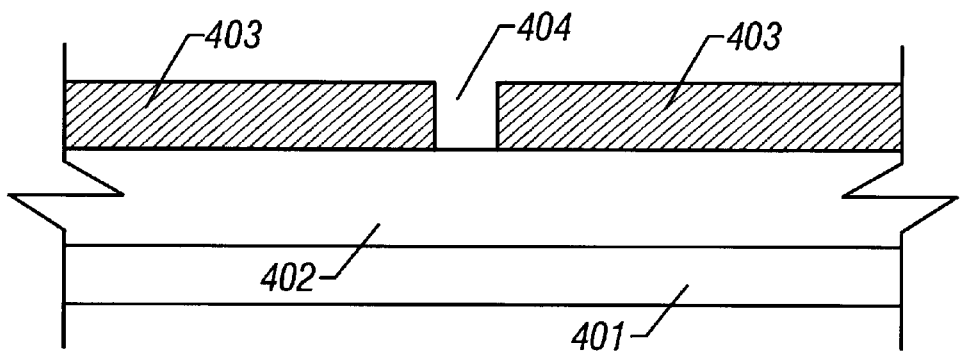
FIGS. 9(A)–9(D) are cross-sectional views, illustrating a process sequence for forming a contact hole in accordance with the invention.
Figure 9B:
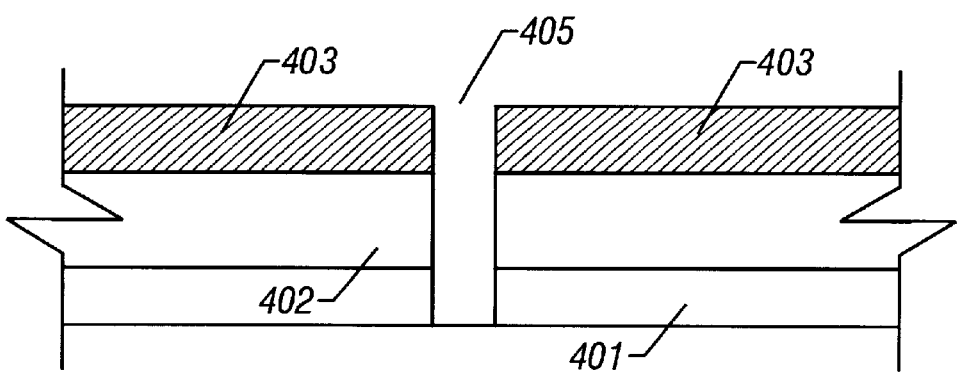
Figure 9C:
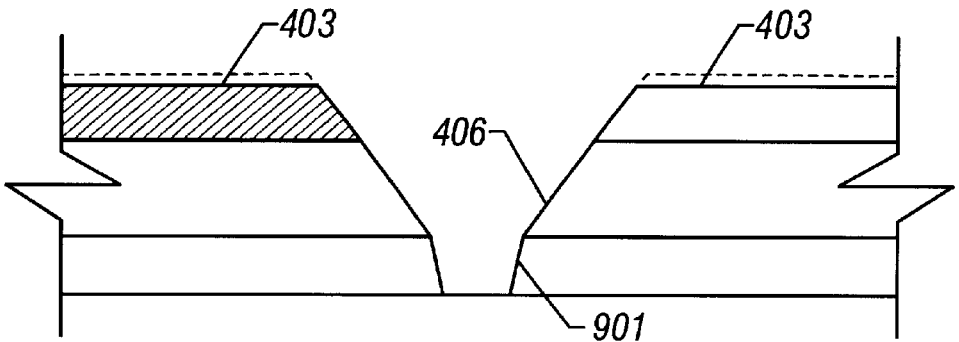
Figure 9D:
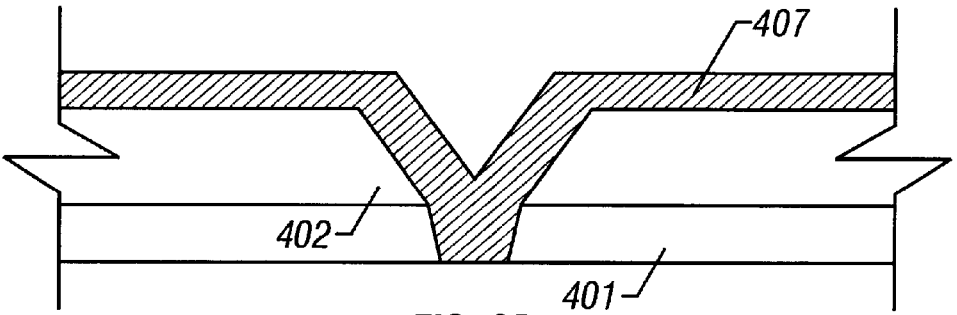

At this time, unlike the method described in Example 1, the second interlayer dielectric film made from a resinous material does not decrease in thickness. Instead, the resist mask 403 is thinned. After the ashing, a dry etching step is again carried out to widen the window hole in the first interlayer dielectric film 401 of silicon oxide or silicon nitride. The widened window hole assumes a tapering shape as indicated by 901. In this way, a state shown in FIG. 9(C) is derived. The resist mask 403 is removed. Then, a metallization layer, or electrodes and conductive interconnects, 407 for making contacts is formed. As a result, a state shown in FIG. 9(D) is obtained. The present example is characterized in that the mask used to form the hole 405 is reused to create window holes 406 and 901 which are tapered so as to facilitate making contacts.

According to the present invention, the opening in the contact hole is widened as indicated by 201 in FIG. 2(A). Therefore, contacts can be easily made even if the contact holes are formed for fine-line patterns. Especially, the window hole 201 shown in FIG. 2(A) is created by self-aligned technology by making use of the previously formed window hole 119. Consequently, it is not necessary to use a new mask. The production yield and reliability of the equipment can be enhanced greatly.

The invention disclosed herein is applied not only to active matrix liquid crystal displays but also to active matrix EL displays and active matrix plasma displays. The invention can also be applied with sufficient utility to multilevel structures such as used in integrated circuits (ICs) consisting of components which have been down-sized.

What is claimed is:

1. A semiconductor device comprising:
    a transistor comprising a source region, a drain region, a channel formation region provided between said source region and said drain region, and a gate electrode provided adjacent to said channel formation region with a gate insulating film therebetween;
    a multilayer dielectric film provided over said transistor and including an insulating layer comprising silicon and a top layer made of a resinous material provided on said insulating layer comprising silicon;
    a contact hole provided in said insulating layer comprising silicon and said top layer, a part of said contact hole provided in said top layer being provided over a part of said contact hole provided in said insulating layer comprising silicon; and
    a wiring extending in said part of said contact hole provided in said top layer and extending in said part of said contact hole provided in said insulating layer comprising silicon, and extending over said top layer, said wiring being connected with one of said source region and said drain region,
    wherein said part of said contact hole provided in said top layer provides a wider opening than said part of said contact hole provided in said insulating layer comprising silicon, wherein said insulating layer comprising silicon has an upper face within said contact hole, and said wiring is provided on said upper face within said part of said contact hole provided in said top layer, and wherein said part of said contact hole provided in said insulating layer comprising silicon is concentric with said part of said contact hole provided in said top layer.

2. The device of claim 1, wherein said top layer made of the resinous material has a planarized surface.

3. The device of claim 1, wherein said transistor is a thin film transistor.

4. The device of claim 1, wherein said wiring comprises indium tin oxide.

5. The device of claim 1, wherein said part of said contact hole provided in said top layer has a diameter of 2 μm.

6. The device of claim 1, wherein said semiconductor device comprises one of an active matrix liquid crystal display, an active matrix EL display, and an active matrix plasma display.

7. The device of claim 1, wherein said insulating layer comprising silicon comprises one of silicon oxide, silicon nitride, and silicon oxynitride.

8. The device of claim 1 wherein said part of said contact hole provided in said insulating layer comprising silicon has a wall vertical to said insulating layer comprising silicon.

9. The device of claim 1 wherein said part of said contact hole provided in said top layer has a tapered edge portion in an upper surface of said top layer.

10. The device of claim 9, wherein said transistor is a thin film transistor.

11. The device of claim 9, wherein said wiring comprises indium tin oxide.

12. The device of claim 9, wherein said part of said contact hole provided in said top layer has a diameter of 2 μm.

13. The device of claim 9, wherein said semiconductor device comprises one of an active matrix liquid crystal display, an active matrix EL display, and an active matrix plasma display.

14. The device of claim 9, wherein said insulating layer comprising silicon comprises one of silicon oxide, silicon nitride, and silicon oxynitride.

15. The device of claim 1 wherein said part of said contact hole provided in said top layer has a rounded edge portion in an upper surface of said top layer.

16. The device of claim 15, wherein said transistor is a thin film transistor.

17. The device of claim 15, wherein said wiring comprises indium tin oxide.

18. The device of claim 15, wherein said part of said contact hole provided in said top layer has a diameter of 2 μm.

19. The device of claim 15, wherein said semiconductor device comprises one of an active matrix liquid crystal display, an active matrix EL display, and an active matrix plasma display.

20. The device of claim 15, wherein said insulating layer comprising silicon comprises one of silicon oxide, silicon nitride, and silicon oxynitride.

21. The device of claim 1 wherein said part of said contact hole provided in said insulating layer comprising silicon has a diameter of 1 μm or less.

22. The device of claim 21, wherein said transistor is a thin film transistor.

23. The device of claim 21, wherein said wiring comprises indium tin oxide.

24. The device of claim 21, wherein said part of said contact hole provided in said top layer has a diameter of 2 μm.

25. The device of claim 21, wherein said semiconductor device comprises one of an active matrix liquid crystal display, an active matrix EL display, and an active matrix plasma display.

26. The device of claim 21, wherein said insulating layer comprising silicon comprises one of silicon oxide, silicon nitride, and silicon oxynitride.

27. A semiconductor device comprising:

a thin film transistor comprising a source region, a drain region, a channel formation region provided between said source region and said drain region, and a gate electrode provided adjacent to said channel formation region with a gate insulating film therebetween;

a multilayer dielectric film provided over said thin film transistor and including an insulating layer comprising silicon and a top layer made of a resinous material provided on said insulating layer comprising silicon;

a contact hole provided in said insulating layer comprising silicon and said top layer, a part of said contact hole provided in said top layer being provided over a part of said contact hole provided in said insulating layer comprising silicon; and a wiring extending in said part of said contact hole provided in said top layer and extending in said part of said contact hole provided in said insulating layer comprising silicon, and extending over said top layer, said wiring being connected with one of said source region and said drain region, wherein said part of said contact hole provided in said top layer provides a wider opening than said part of said contact hole provided in said insulating layer comprising silicon, wherein said insulating layer comprising silicon has an upper face within said contact hole, and said wiring is provided on said upper face within said part of said contact hole provided in said top layer, and wherein said part of said contact hole provided in said insulating layer comprising silicon is concentric with said part of said contact hole provided in said top layer.

28. A semiconductor device comprising:

a transistor comprising a source region, a drain region, a channel formation region provided between said source region and said drain region, and a gate electrode provided adjacent to said channel formation region with a gate insulating film therebetween;

a multilayer dielectric film provided over said transistor and including an insulating layer comprising silicon and a top layer made of a resinous material provided on said insulating layer comprising silicon;

a contact hole provided in said insulating layer comprising silicon and said top layer, a part of said contact hole provided in said top layer being provided over a part of said contact hole provided in said insulating layer comprising silicon; and a wiring extending in said part of said contact hole provided in said top layer and extending in said part of said contact hole provided in said insulating layer comprising silicon, and extending over said top layer, said wiring being connected with one of said source region and said drain region, wherein said part of said contact hole provided in said top layer provides a wider opening than said part of said contact hole provided in said insulating layer comprising silicon, wherein said insulating layer comprising silicon has an upper face within said contact hole, and said wiring is provided on said upper face within said part of said contact hole provided in said top layer, wherein said part of said contact hole provided in said insulating layer comprising silicon is concentric with said part of said contact hole provided in said top layer, and wherein said wiring comprises indium tin oxide.

29. A semiconductor device comprising:

a transistor comprising a source region, a drain region, a channel formation region provided between said source region and said drain region, and a gate electrode provided adjacent to said channel formation region with a gate insulating film therebetween;

a multilayer dielectric film provided over said transistor and including an insulating layer comprising silicon and a top layer made of a resinous material provided on said insulating layer comprising silicon;

a contact hole provided in said insulating layer comprising silicon and said top layer, a part of said contact hole provided in said top layer being provided over a part of said contact hole provided in said insulating layer comprising silicon; and a wiring extending in said part of said contact hole provided in said top layer and extending in said part of said contact hole provided in said insulating layer comprising silicon, and extending over said top layer, said wiring being connected with one of said source region and said drain region, wherein said part of said contact hole provided in said top layer provides a wider opening than said part of said contact hole provided in said insulating layer comprising silicon, wherein said insulating layer comprising silicon has an upper face within said contact hole, and said wiring is provided on said upper face within said part of said contact hole provided in said top layer, wherein said part of said contact hole provided in said insulating layer comprising silicon is concentric with said part of said contact hole provided in said top layer, and wherein said semiconductor device comprises an active matrix EL display.

30. A semiconductor device comprising:

a transistor comprising a source region, a drain region, a channel formation region provided between said source region and said drain region, and a gate electrode provided adjacent to said channel formation region with a gate insulating film therebetween;

a multilayer dielectric film provided over said transistor and including an insulating layer comprising silicon and a top layer made of a resinous material provided on said insulating layer comprising silicon;

a contact hole provided in said insulating layer comprising silicon and said top layer, a part of said contact hole provided in said top layer being provided over a part of said contact hole provided in said insulating layer comprising silicon; and a wiring extending in said part of said contact hole provided in said top layer and extending in said part of said contact hole provided in said insulating layer comprising silicon, and extending over said top layer, said wiring being connected with one of said source region and said drain region, wherein said part of said contact hole provided in said top layer provides a wider opening than said part of said contact hole provided in said insulating layer comprising silicon, wherein said insulating layer comprising silicon has an upper face within said contact hole, and said wiring is provided on said upper face within said part of said contact hole provided in said top layer, wherein said part of said contact hole provided in said insulating layer comprising silicon is concentric with said part of said contact hole provided in said top layer, and wherein said semiconductor device comprises an active matrix liquid crystal display.

31. A semiconductor device comprising:

a transistor comprising a source region, a drain region, a channel formation region provided between said source region and said drain region, and a gate electrode provided adjacent to said channel formation region with a gate insulating film therebetween;

a multilayer dielectric film provided over said transistor and including an insulating layer comprising silicon and a top layer made of a resinous material provided on said insulating layer comprising silicon;

a contact hole provided in said insulating layer comprising silicon and said top layer, a part of said contact hole provided in said top layer being provided over a part of said contact hole provided in said insulating layer comprising silicon; and a wiring extending in said part of said contact hole provided in said top layer and extending in said part of said contact hole provided in said insulating layer comprising silicon, and extending over said top layer, said wiring being connected with one of said source region and said drain region, wherein said part of said contact hole provided in said top layer provides a wider opening than said part of said contact hole provided in said insulating layer comprising silicon, wherein said insulating layer comprising silicon has an upper face within said contact hole, and said wiring is provided on said upper face within said part of said contact hole provided in said top layer, wherein said part of said contact hole provided in said insulating layer comprising silicon is concentric with said part of said contact hole provided in said top layer, and wherein said semiconductor device comprises an active matrix plasma display.

32. A semiconductor device comprising:

a transistor comprising a source region, a drain region, a channel formation region provided between said source region and said drain region, and a gate electrode provided adjacent to said channel formation region with a gate insulating film therebetween;

a multilayer dielectric film provided over said transistor and including an insulating layer comprising silicon and a top layer made of a resinous material provided on said insulating layer comprising silicon;

a contact hole provided in said insulating layer comprising silicon and said top layer, a part of said contact hole provided in said top layer being provided over a part of said contact hole provided in said insulating layer comprising silicon; and a wiring extending in said part of said contact hole provided in said top layer and extending in said part of said contact hole provided in said insulating layer comprising silicon, and extending over said top layer, said wiring being connected with one of said source region and said drain region, wherein said part of said contact hole provided in said top layer provides a wider opening than said part of said contact hole provided in said insulating layer comprising silicon, wherein said insulating layer comprising silicon has an upper face within said contact hole, and said wiring is provided on said upper face within said part of said contact hole provided in said top layer, and wherein said part of said contact hole provided in said insulating layer comprising silicon is concentric with said part of said contact hole provided in said top layer, and wherein said insulating layer comprising silicon comprises a material selected from the group consisting of silicon oxide, silicon nitride and silicon oxynitride.

* * * * *